United States Patent
Wang et al.

(10) Patent No.: US 7,719,325 B1
(45) Date of Patent: May 18, 2010

(54) ACTIVE-LOAD DOMINANT CIRCUIT FOR COMMON-MODE GLITCH INTERFERENCE CANCELLATION

(75) Inventors: Yen-Ping Wang, Taipei (TW); Yen-Hui Wang, Hsinchu (TW); Pei-Yuan Chen, Longtan Township, Taoyuan County (TW)

(73) Assignee: Grenergy Opto, Inc., Hsin-Chu (TW)

( * ) Notice: Subject to any disclaimer, the term of this patent is extended or adjusted under 35 U.S.C. 154(b) by 0 days.

(21) Appl. No.: 12/273,011

(22) Filed: Nov. 18, 2008

(51) Int. Cl.
 *H03B 1/00* (2006.01)
(52) U.S. Cl. .................. 327/112; 327/382; 326/87
(58) Field of Classification Search ............. 326/82, 326/83, 87, 88; 327/34, 108, 109, 111, 112, 327/311, 382, 551, 552
See application file for complete search history.

(56) References Cited

U.S. PATENT DOCUMENTS

| | | | | |
|---|---|---|---|---|
| 5,572,156 A | * | 11/1996 | Diazzi et al. | 327/109 |
| 5,742,196 A | * | 4/1998 | Fronen et al. | 327/382 |
| 6,353,345 B1 | * | 3/2002 | Yushan et al. | 327/112 |
| 6,646,469 B2 | * | 11/2003 | Yushan | 326/83 |
| 7,061,195 B2 | * | 6/2006 | Ho et al. | 318/438 |

* cited by examiner

*Primary Examiner*—Lincoln Donovan
*Assistant Examiner*—William Hernandez
(74) *Attorney, Agent, or Firm*—Ming Chow; Sinorica, LLC (57) ABSTRACT

An active-load dominant circuit for common-mode glitch interference cancellation, biased between a first voltage potential and a second voltage potential with an accompanying common-mode glitch interferer. The active-load dominant circuit includes a pair of pull-up networks and a pair of active-load networks. The common-mode glitch interferer is cancelled out due to a symmetric structure of the pair of pull-up networks. At least one set signal and at least one reset signal are provided to a latch in response to a clock signal or a complemented clock signal. At least one of the set signal and the reset signal can be pulled up to the first voltage potential or pulled down to the second voltage potential. The voltage difference of the set signal and the reset signal is large enough for a latch.

11 Claims, 12 Drawing Sheets

ACTIVE-LOAD DOMINANT CIRCUIT FOR COMMON-MODE GLITCH INTERFERENCE CANCELLATION

BACKGROUND OF THE INVENTION

1. Field of the Invention

The present invention relates to a pulse filter, and more particularly to a pulse filter capable of performing common-mode glitch interference cancellation in a half-bridge or full-bridge high-side driver.

2. Description of the Related Art

Figure 1:
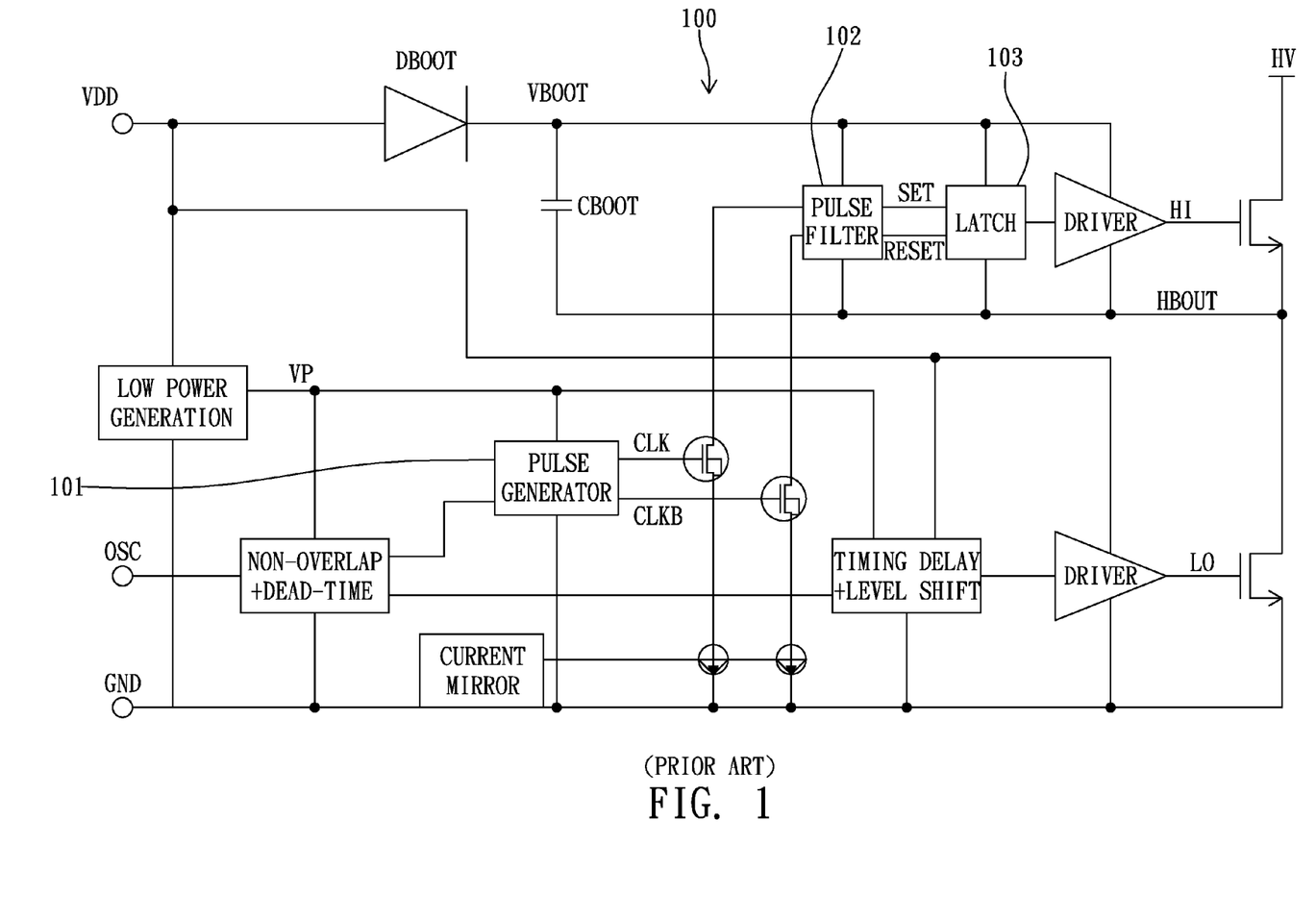
FIG. 1 is the architecture of a typical half-bridge driver.

To describe the related art of the present invention, the relation between a pulse filter and a half-bridge or full-bridge high-side driver shall be introduced first. Please refer to FIG. 1, which shows the architecture of a typical half-bridge driver 100. As shown in FIG. 1, the typical half-bridge driver 100 at least includes a pulse generator 101, a pulse filter 102, and a latch 103.

The pulse generator 101 is used for generating a clock (CLK) signal and a complemented clock (CLKB) signal. The pulse filter 102 is used for cancelling a common-mode glitch interference accompanying the power lines of VBOOT and HBOUT, and generating a set signal and a reset signal to the latch 103. The latch 103 is used for sending a signal to a driver to switch a high-side power MOSFET. During the switching, a glitch is generated due to the capacitive characteristic of a capacitor CBOOT, i.e., the voltage difference hold between the two plates of a capacitor will not change abruptly. As a result, the certain period the capacitor takes to reach a stable state causes a glitch period. The pulse filter 102 is therefore used to deal with the glitch problem to prevent the failure of the latch 103.

Figure 2:
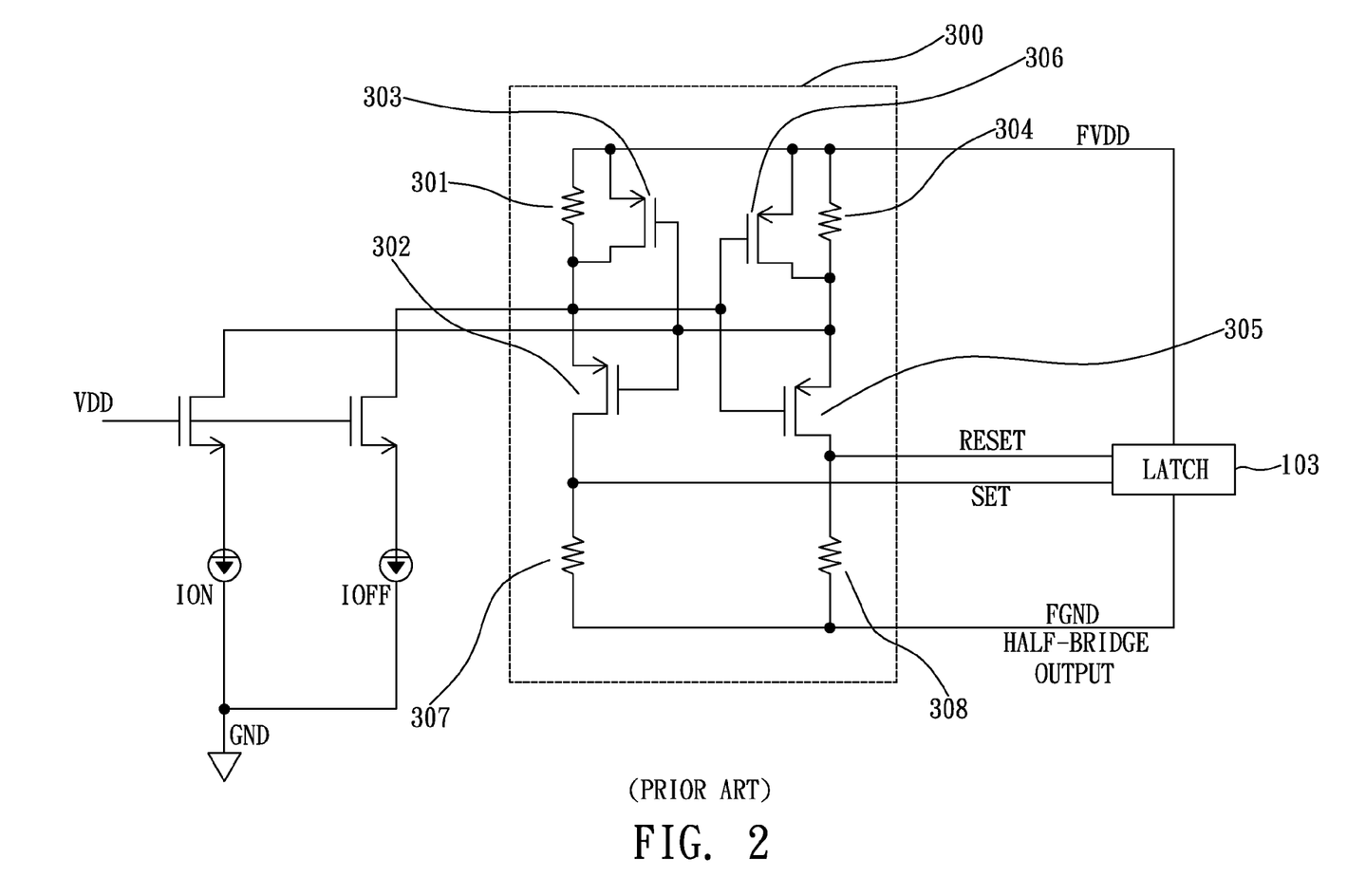
FIG. 2 is a circuit diagram of a prior art pulse filter.

One solution to eliminate the glitch interferer is to use a symmetric structure to cancel it in differential way. Please refer to FIG. 2, which shows a circuit diagram of a prior art pulse filter 300 for cancelling the common-mode glitch interferer of power lines. As shown in FIG. 2, the prior art pulse filter 300 comprises a resistor 301, a PMOS transistor 302, a PMOS transistor 303, a resistor 304, a PMOS transistor 305, a PMOS transistor 306, a resistor 307, and a resistor 308.

The pulse filter 300 comprises a pair of pull-up networks and a pair of pull-down networks. The left side pull-up network is composed of the resistor 301, the PMOS transistor 302, and the PMOS transistor 303, and the right side pull-up network is composed of the resistor 304, the PMOS transistor 305, and the PMOS transistor 306. The left side pull-down network is composed of the resistor 307, and the right side pull-down network is composed of the resistor 308.

Due to the symmetric structure, the voltage potentials at the gate and the source of the PMOS transistor 302 and the PMOS transistor 305 will change simultaneously when a glitch is produced in the power lines so that the voltage difference between the gate and the source of both transistors remain unchanged. The conduction status in each transistor, for example the PMOS transistor 302 being on and the PMOS transistor 305 being off, therefore remains unchanged too. However, the voltage potential built up at the resistor 307 will still be suppressed even though the PMOS transistor 303 is added for improving the voltage swing for the latch 103, if the glitch downs too low. This may also cause the latch 103 malfunction. Besides, the dc conducting path of the resistor 301, the transistor 302, the transistor 303, and the resistor 307 consumes a lot of power, and the resistors also occupy large die area.

As a result, the issues of voltage dropt, power consumption, and die area of a pulse filter are then tangled in the design process.

Therefore, there is a demand to provide a robust pulse filter with low power consumption that can offer great voltage swing of the set signal and the reset signal in spite of the glitch and guarantee the normal operation of the latch.

SUMMARY OF THE INVENTION

In view of the description above, an objective of the present invention is to provide an effective and robust means of glitch interference cancellation of a half-bridge or full-bridge high-side driver.

A still another objective of the present invention is to further provide a novel active-load dominant circuit capable of generating a large voltage swing for driving a latch so that the latch can be easily implemented to operate normally.

A still another objective of the present invention is to further provide a novel active-load dominant circuit capable of generating a large voltage swing without dc power consumption.

A still another objective of the present invention is to further provide a novel active-load dominant circuit capable of generating a large voltage swing, which occupies only small area.

A still another objective of the present invention is to further provide a novel active-load dominant circuit capable of generating at least one set signal and at least one reset signal that can utilize the glitch transient to solve the common-mode glitch problem.

The present novel means of glitch interference cancellation, with a pair of proposed active-load dominant networks and a pair of pull-up networks, can be utilized to provide a large voltage swing of at least one set signal and at least one reset signal to accomplish a common-mode glitch interference cancellation. The present novel invention can greatly reduce the common-mode glitch interferer around the power lines, reduce the die area, and consume no dc power.

An active-load dominant circuit is proposed for performing common-mode glitch interference cancellation in for example but not limited to a half-bridge or full-bridge high-side driver. The active-load dominant circuit biased between a supply voltage potential and a reference ground potential with a common-mode glitch interferer, comprising: a pair of pull-up networks capable of cancelling the common-mode glitch interferer due to a symmetric structure, providing access to the supply voltage potential in response to a clock signal or a complemented clock signal; and a pair of active-load networks placed between the pair of pull-up networks and the reference ground potential, for generating at least one set signal and at least one reset signal for a latch.

In the circuit, the pair of active-load networks comprise at least one pair of active devices for access to the reference ground potential, in response to the clock signal or the complemented clock signal. Each of the set signal and reset signal is supplied either from the supply voltage potential through the pull-up network or from the reference ground potential through the active-load network.

The large voltage swing of the present invention is due to the design that each of the set signal and the reset signal is supplied from the supply voltage potential through the pull-up network, or pulled down to the reference ground through the active-load network. No dc conducting path exists in each of set and reset conditions. Since the set and reset signals can be assigned without dc current, the resistors in the pull-down network can then be omitted and both the power consumption and the die area can be minimized.

To make it easier for our examiner to understand the objective of the invention, its structure, innovative features, and performance, we use a preferred embodiment together with the attached drawings for the detailed description of the invention.

DETAILED DESCRIPTION OF THE PREFERRED EMBODIMENTS

The present invention will be described in more detail hereinafter with reference to the accompanying drawings that show the preferred embodiments of the invention.

As is mentioned in the description of the related art, the pulled-down networks constructed with resistors will definitely consume dc power in building up a set signal level or a reset signal level. However, according to the CMOS logic, the output level is pulled up to the supply voltage or pulled down to the ground and consumes no dc power. Besides, if the latch doesn't take response during the glitch period, then the fault actions of the latch can then be avoided. The present invention grasps these points and offers a variety of solutions which will be disclosed in the following description.

Figure 3:
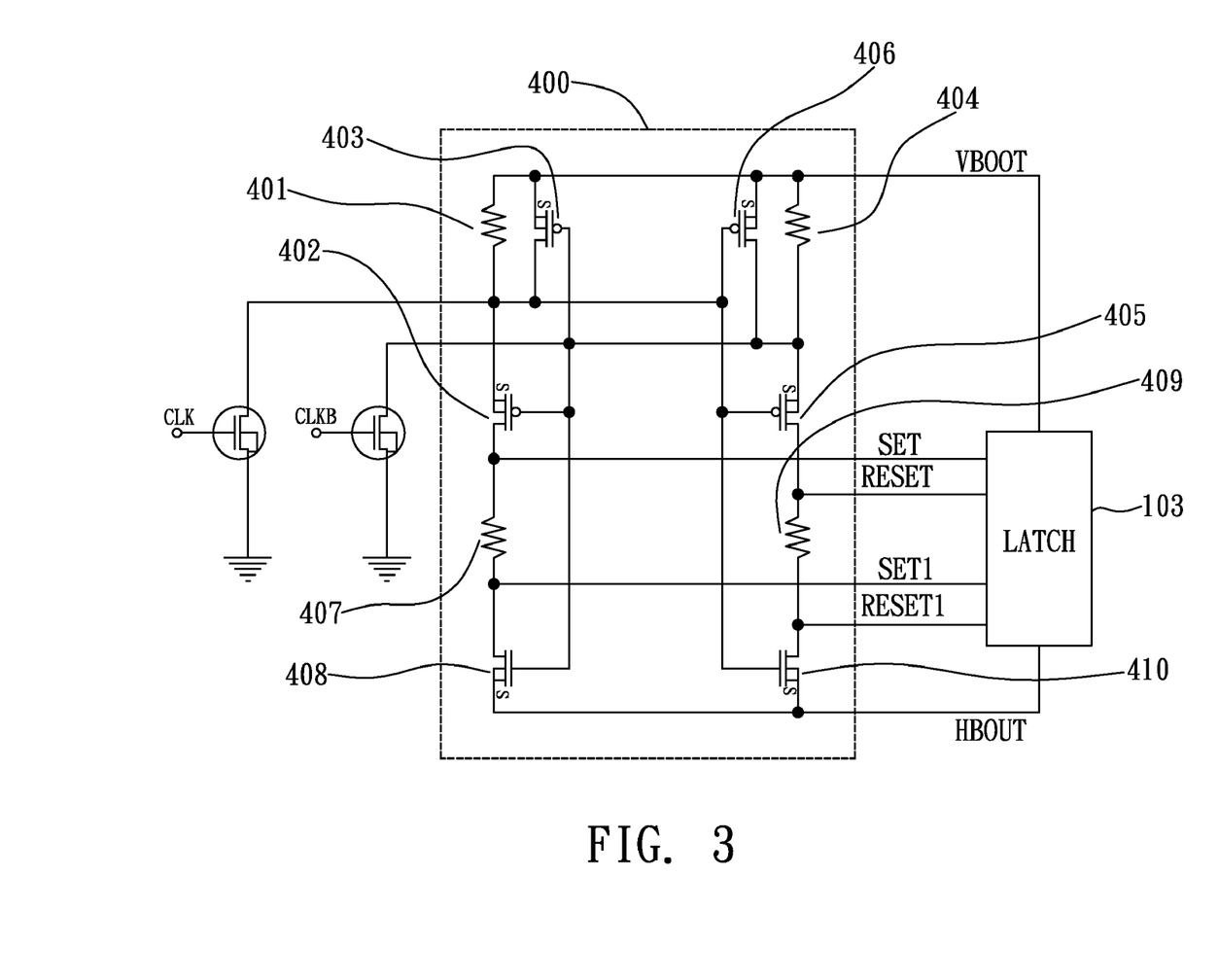
FIG. 3 is a circuit diagram of a preferred embodiment of the present invention for common-mode glitch interference cancellation.

Please refer to FIG. 3, which shows a circuit diagram of a preferred embodiment of the present invention for common-mode glitch interference cancellation. As shown in the FIG. 3, the pulse filter 400 includes a resistor 401, a PMOS transistor 402, a PMOS transistor 403, a resistor 404, a PMOS transistor 405, a PMOS transistor 406, a resistor 407, an NMOS transistor 408, a resistor 409, and an NMOS transistor 410. A complemented clock (CLKB) signal is coupled to the gate of said PMOS transistor 402, the gate of said NMOS transistor 408, the gate of said PMOS transistor 403 and the drain of said PMOS transistor 406, and a clock (CLK) signal is coupled to the gate of said PMOS transistor 405, the gate of said NMOS transistor 410, the gate of said PMOS transistor 406 and the drain of said PMOS transistor 403.

In this embodiment, the pulse filter 400 comprises a pair of pull-up networks and a pair of pull-down networks. The pair of pull-up networks comprises the resistor 401, the PMOS transistor 402, and the PMOS transistor 403 in one side, for example the left side, and comprise the resistor 404, the PMOS transistor 405, and the PMOS transistor 406 in the other side, i.e. the right side. The left side pull-down network is composed of the resistor 407 and the NMOS transistor 408, and the right side pull-down network is composed of the resistor 409 and the NMOS transistor 410.

Due to the symmetric structure, the voltage potentials at the gate and the source of the PMOS transistor 402 and the PMOS transistor 405 will change simultaneously when a glitch is produced in the power lines so that the voltage difference between the gate and the source of both transistors remain unchanged. The conduction status in response to the CLK signal and the CLKB signal in the PMOS transistor 402 and the PMOS transistor 405, for example the PMOS transistor 402 being on and the PMOS transistor 405 being off, therefore remains unchanged too. The NMOS transistor 408 is off, the NMOS transistor 410 is on and no dc conducting path is present.

Besides, since the SET/RESET signal and the SET1/RESET1 signal are different in the glitch period, the present invention takes advantage of this trait to create a design that only when the SET/RESET signal level is equal to the SET1/RESET1 signal level then the latch 103 will take response. This design makes sure the latch 103 will operate normally. Furthermore, since neither the SET signal nor the RESET signal needs dc current to maintain a high level, both the resistor 407 and the resistor 409 can be of small resistance, and occupy small die area.

Figure 4:
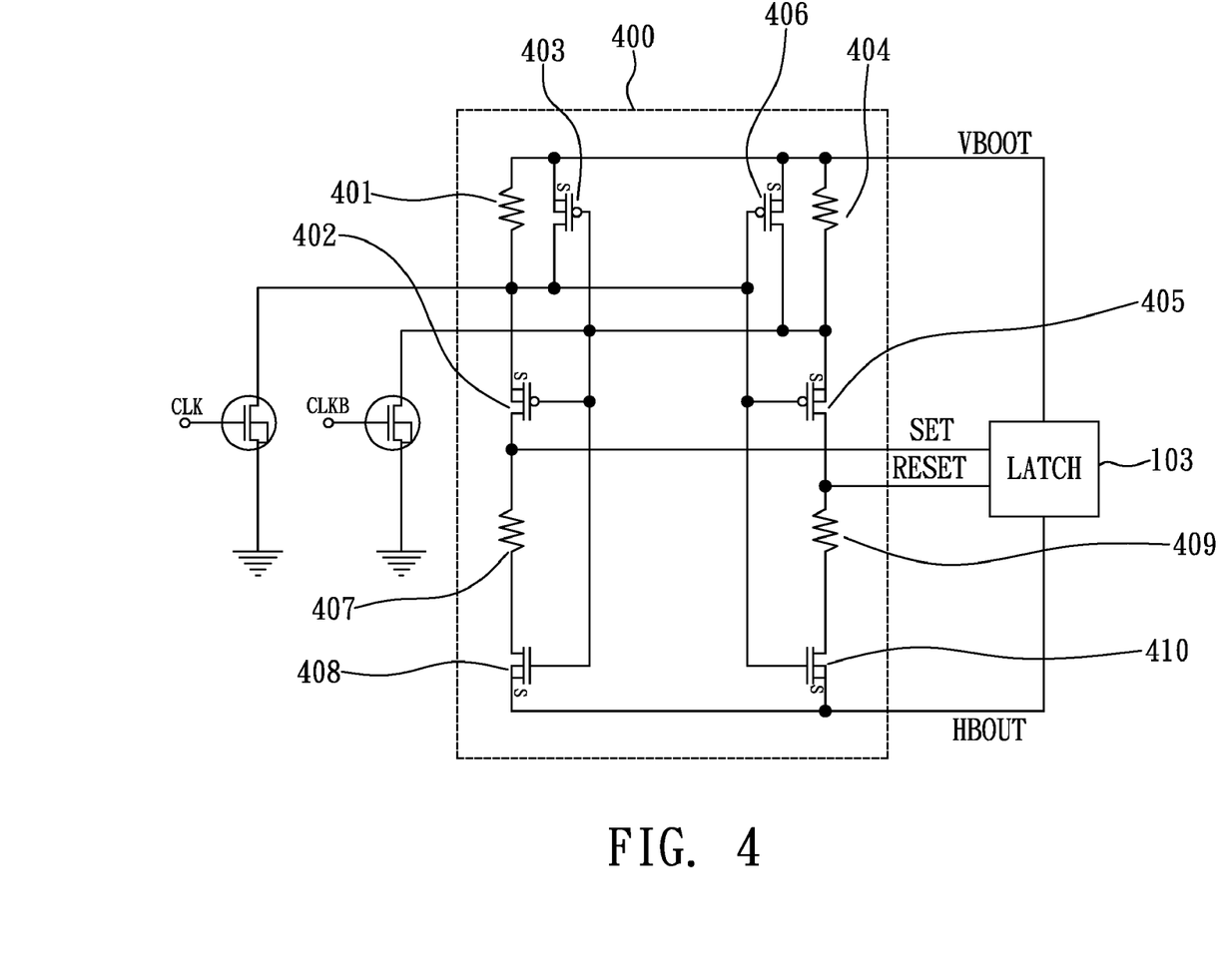
FIG. 4 is a circuit diagram of another preferred embodiment of the present invention for common-mode glitch interference cancellation.

Please refer to FIG. 4, which shows a circuit diagram of another preferred embodiment of the present invention for common-mode glitch interference cancellation. As shown in the FIG. 4, the pulse filter 400 includes a resistor 401, a PMOS transistor 402, a PMOS transistor 403, a resistor 404, a PMOS transistor 405, a PMOS transistor 406, a resistor 407, an NMOS transistor 408, a resistor 409, and an NMOS transistor 410. A CLK signal and a CLKB signal are coupled to the pulse filter 400 in the way as shown in the FIG. 4.

In this embodiment, the pulse filter 400 comprises a pair of pull-up networks and a pair of pull-down networks. The left side pull-up network is composed of the resistor 401, the PMOS transistor 402, and the PMOS transistor 403, and the right side pull-up network is composed of the resistor 404, the PMOS transistor 405, and the PMOS transistor 406. The left side pull-down network is composed of the resistor 407 and the NMOS transistor 408, and the right side pull-down network is composed of the resistor 409 and the NMOS transistor 410.

Due to the symmetric structure, the voltage potentials at the gate and the source of the PMOS transistor 402 and the PMOS transistor 405 will change simultaneously when a glitch is produced in the power lines and the voltage difference between the gate and the source of both transistors remain unchanged. The conduction status in response to the CLK signal and the CLKB signal in the PMOS transistor 402 and the PMOS transistor 405, for example the PMOS transistor 402 being on and the PMOS transistor 405 being off, therefore remains unchanged too. The NMOS transistor 408 is off, the NMOS transistor 410 is on and no dc conducting path is present.

Besides, since the SET signal from the up terminal of the resistor 407 and the RESET signal from the up terminal of the resistor 409 are exclusively pulled up to the VBOOT potential or pulled down to the HBOUT potential, the present invention provides a large voltage swing for the following latch 103, and a large noise margin latch 103 is afforded.

Figure 5:
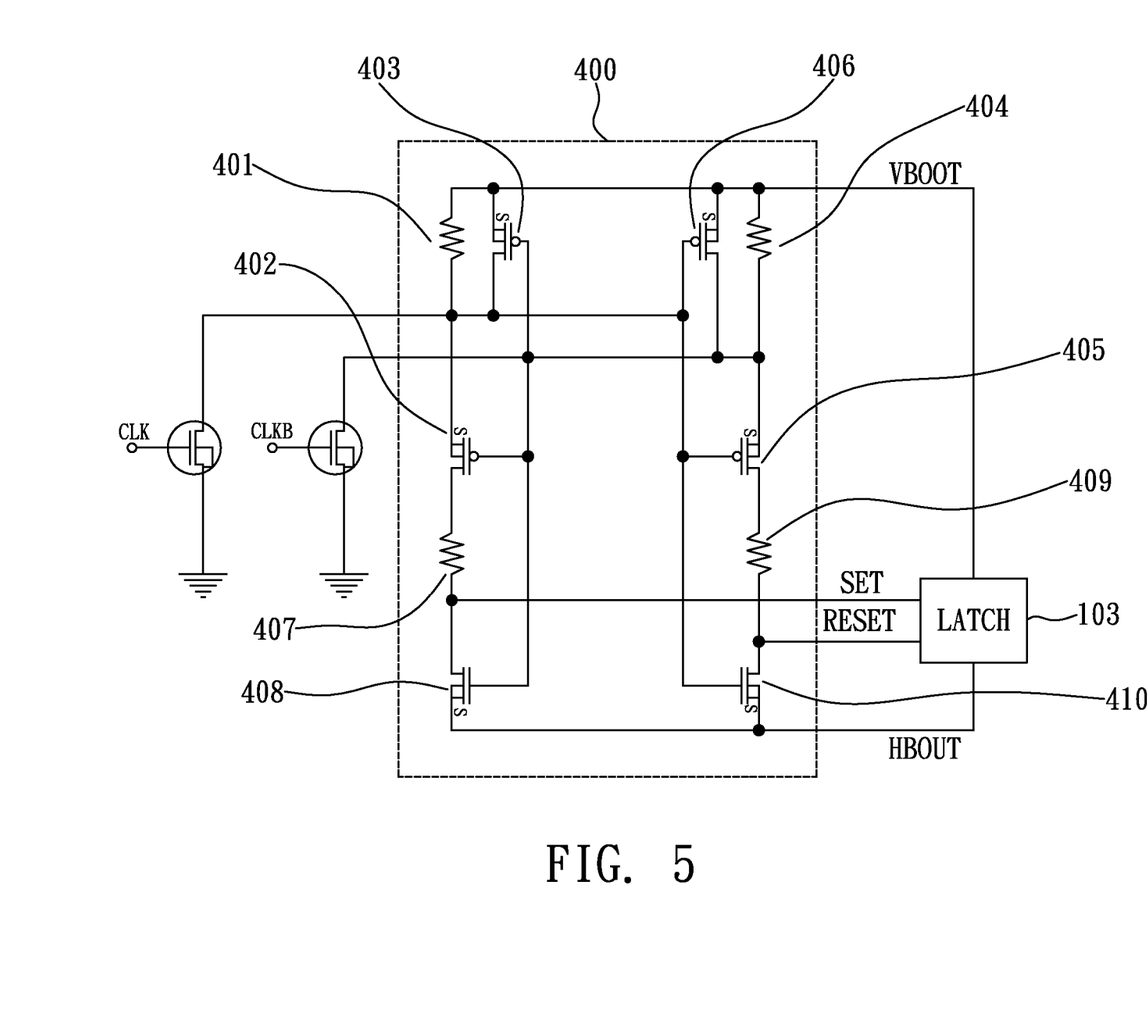
FIG. 5 is a circuit diagram of another preferred embodiment of the present invention for common-mode glitch interference cancellation.

Please refer to FIG. 5, which shows a circuit diagram of another preferred embodiment of the present invention for common-mode glitch interference cancellation. As shown in the FIG. 5, the pulse filter 400 includes a resistor 401, a PMOS transistor 402, a PMOS transistor 403, a resistor 404, a PMOS transistor 405, a PMOS transistor 406, a resistor 407, an NMOS transistor 408, a resistor 409, and an NMOS transistor 410. A CLK signal and a CLKB signal are coupled to the pulse filter 400 in the way as shown in the FIG. 5.

In this embodiment, the pulse filter 400 comprises a pair of pull-up networks and a pair of pull-down networks. The left side pull-up network is composed of the resistor 401, the PMOS transistor 402, and the PMOS transistor 403, and the right side pull-up network is composed of the resistor 404, the PMOS transistor 405, and the PMOS transistor 406. The left side pull-down network is composed of the resistor 407 and the NMOS transistor 408, and the right side pull-down network is composed of the resistor 409 and the NMOS transistor 410.

Due to the symmetric structure, the voltage potentials at the gate and the source of the PMOS transistor 402 and the PMOS transistor 405 will change simultaneously when a glitch is produced in the power lines so that the voltage difference between the gate and the source of both transistors remain unchanged. The conduction status in response to the CLK signal and the CLKB signal in the PMOS transistor 402 and the PMOS transistor 405, for example the PMOS transistor 402 being on and the PMOS transistor 405 being off, therefore remains unchanged too. The NMOS transistor 408 is off, the NMOS transistor 410 is on and no dc conducting path is present.

Besides, since the SET signal from the low terminal of the resistor 407 and the RESET signal from the low terminal of the resistor 409 are exclusively pulled up to the VBOOT potential or pulled down to the HBOUT potential, the present invention then provides a large voltage swing for the following latch 103, and a large noise margin latch 103 is afforded.

Figure 6:
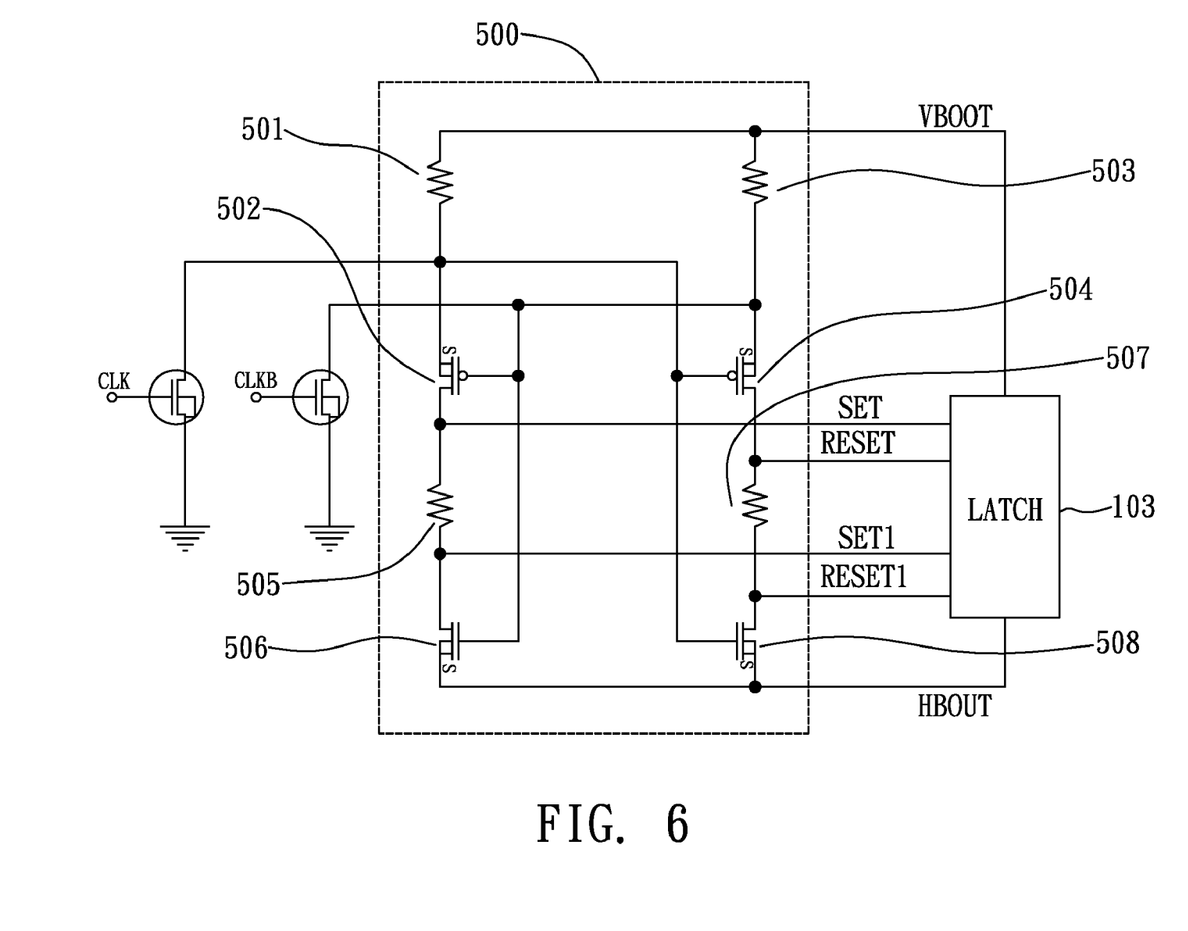
FIG. 6 is a circuit diagram of another preferred embodiment of the present invention for common-mode glitch interference cancellation.

Please refer to FIG. 6, which shows a circuit diagram of a preferred embodiment of the present invention for common-mode glitch interference cancellation. As shown in the FIG. 6, the pulse filter 500 includes a resistor 501, a PMOS transistor 502, a resistor 503, a PMOS transistor 504, a resistor 505, an NMOS transistor 506, a resistor 507, and an NMOS transistor 508. A CLK signal and a CLKB signal are coupled to the pulse filter 500 in the way as shown in the FIG. 6.

In this embodiment, the pulse filter 500 comprises a pair of pull-up networks and a pair of pull-down networks. The left side pull-up network is composed of the resistor 501 and the PMOS transistor 502, and the right side pull-up network is composed of the resistor 503 and the PMOS transistor 504. The left side pull-down network is composed of the resistor 505 and the NMOS transistor 506, and the right side pull-down network is composed of the resistor 507 and the NMOS transistor 508.

Due to the symmetric structure, the voltage potentials at the gate and the source of the PMOS transistor 502 and the PMOS transistor 504 will change simultaneously when a glitch is produced in the power lines so that the voltage difference between the gate and the source of both transistors remain unchanged. The conduction status in response to the CLK signal and the CLKB signal in the PMOS transistor 502 and the PMOS transistor 504, for example the PMOS transistor 502 being on and the PMOS transistor 504 being off, therefore remains unchanged too. The NMOS transistor 506 is off, the NMOS transistor 508 is on and no dc conducting path is present.

Besides, since the SET/RESET signal and the SET1/RESET1 signal are different in the glitch period, the present invention takes advantage of this phenomenon to create a design that only when the SET/RESET signal level is equal to the SET1/RESET1 signal level then the latch 103 will take response. This design makes sure the latch 103 will operate normally.

Figure 7:
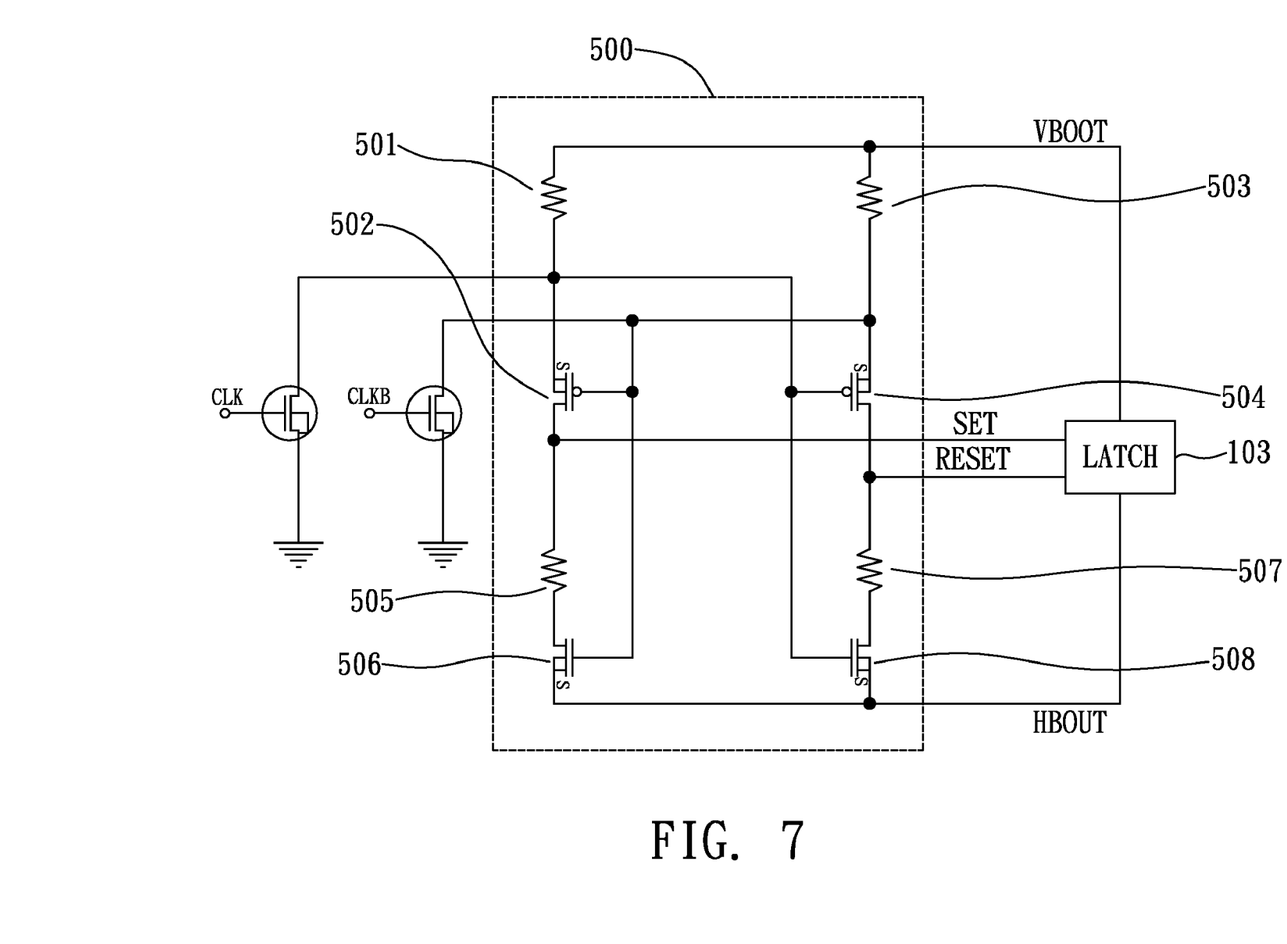
FIG. 7 is a circuit diagram of another preferred embodiment of the present invention for common-mode glitch interference cancellation.

Please refer to FIG. 7, which shows a circuit diagram of a preferred embodiment of the present invention for common-mode glitch interference cancellation. As shown in the FIG. 7, the pulse filter 500 includes a resistor 501, a PMOS transistor 502, a resistor 503, a PMOS transistor 504, a resistor 505, an NMOS transistor 506, a resistor 507, and an NMOS transistor 508. A CLK signal and a CLKB signal are coupled to the pulse filter 500 in the way as shown in the FIG. 7.

In this embodiment, the pulse filter 500 comprises a pair of pull-up networks and a pair of pull-down networks. The left side pull-up network is composed of the resistor 501 and the PMOS transistor 502, and the right side pull-up network is composed of the resistor 503 and the PMOS transistor 504. The left side pull-down network is composed of the resistor 505 and the NMOS transistor 506, and the right side pull-down network is composed of the resistor 507 and the NMOS transistor 508.

Due to the symmetric structure, the voltage potentials at the gate and the source of the PMOS transistor 502 and the PMOS transistor 504 will change simultaneously when a glitch is produced in the power lines so that the voltage difference between the gate and the source of both transistors remain unchanged. The conduction status in response to the CLK signal and the CLKB signal in the PMOS transistor 502 and the PMOS transistor 504, for example the PMOS transistor 502 being on and the PMOS transistor 504 being off, therefore remains unchanged too. The NMOS transistor 506 is off, the NMOS transistor 508 is on and no dc conducting path is present.

Besides, since the SET signal from the up terminal of the resistor 505 and the RESET signal from the up terminal of the resistor 507 are exclusively pulled up to the VBOOT potential or pulled down to the HBOUT potential, the present invention provides a large voltage swing for the following latch 103, and a large noise margin latch 103 is afforded.

Figure 8:
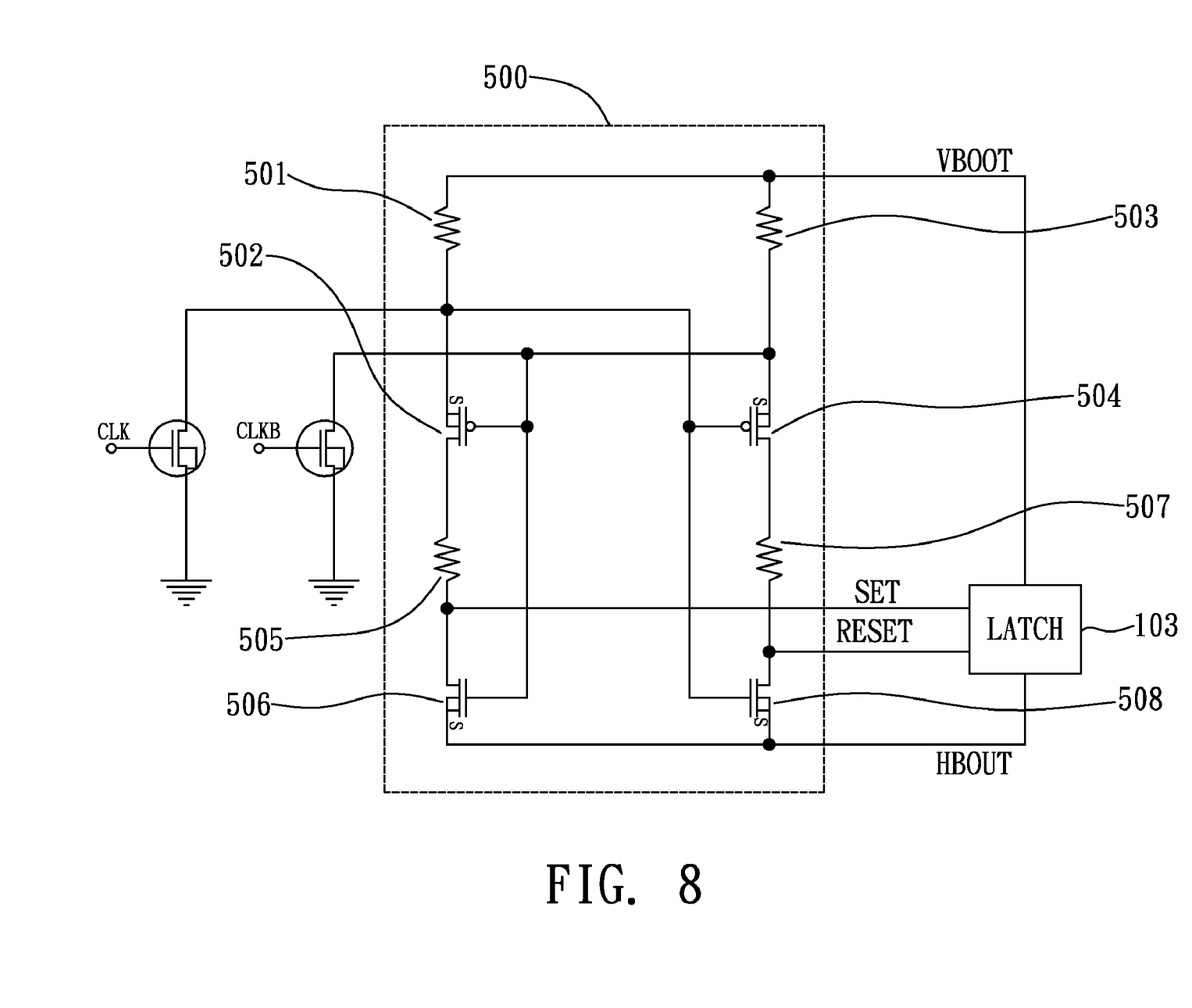
FIG. 8 is a circuit diagram of another preferred embodiment of the present invention for common-mode glitch interference cancellation.

Please refer to FIG. 8, which shows a circuit diagram of a preferred embodiment of the present invention for common-mode glitch interference cancellation. As shown in the FIG. 8, the pulse filter 500 includes a resistor 501, a PMOS transistor 502, a resistor 503, a PMOS transistor 504, a resistor 505, an NMOS transistor 506, a resistor 507, and an NMOS transistor 508. A CLK signal and a CLKB signal are coupled to the pulse filter 500 in the way as shown in the FIG. 8.

In this embodiment, the pulse filter 500 comprises a pair of pull-up networks and a pair of pull-down networks. The left side pull-up network is composed of the resistor 501 and the PMOS transistor 502, and the right side pull-up network is composed of the resistor 503 and the PMOS transistor 504. The left side pull-down network is composed of the resistor 505 and the NMOS transistor 506, and the right side pull-down network is composed of the resistor 507 and the NMOS transistor 508.

Due to the symmetric structure, the voltage potentials at the gate and the source of the PMOS transistor 502 and the PMOS transistor 504 will change simultaneously when a glitch is produced in the power lines so that the voltage difference between the gate and the source of both transistors remain unchanged. The conduction status in response to the CLK signal and the CLKB signal in the PMOS transistor 502 and the PMOS transistor 504, for example the PMOS transistor 502 being on and the PMOS transistor 504 being off, therefore remains unchanged too. The NMOS transistor 506 is off, the NMOS transistor 508 is on and no dc conducting path is present.

Besides, since the SET signal from the low terminal of the resistor 505 and the RESET signal from the low terminal of the resistor 507 are exclusively pulled up to the VBOOT potential or pulled down to the HBOUT potential, the present invention provides a large voltage swing for the following latch 103, and a large noise margin latch 103 is afforded.

Figure 9:
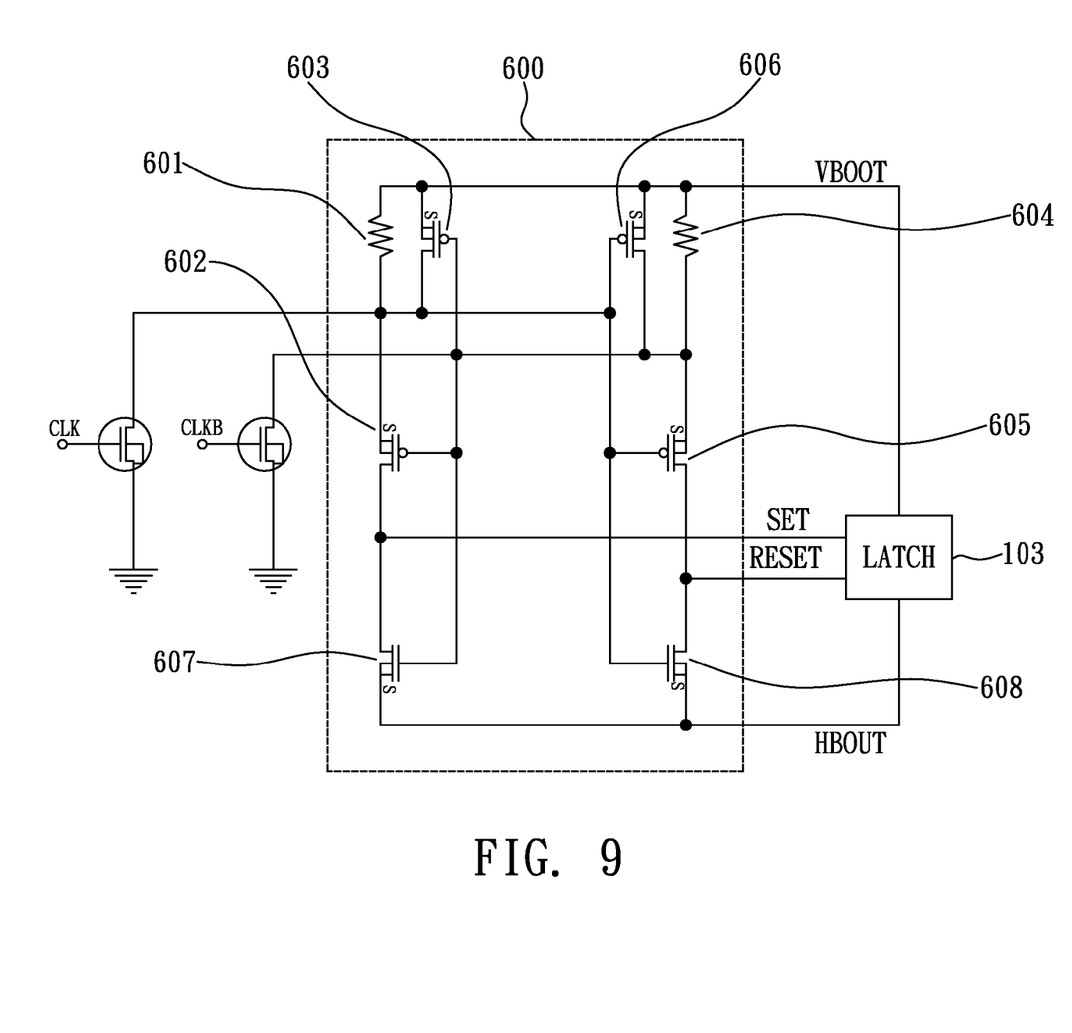
FIG. 9 is a circuit diagram of another preferred embodiment of the present invention for common-mode glitch interference cancellation.

Please refer to FIG. 9, which shows a circuit diagram of another preferred embodiment of the present invention for common-mode glitch interference cancellation. As shown in the FIG. 9, the pulse filter 600 includes a resistor 601, a PMOS transistor 602, a PMOS transistor 603, a resistor 604, a PMOS transistor 605, a PMOS transistor 606, an NMOS transistor 607, and an NMOS transistor 608. A CLK signal and a CLKB signal are coupled to the pulse filter 600 in the way as shown in the FIG. 9.

In this embodiment, the pulse filter 600 comprises a pair of pull-up networks and a pair of pull-down networks. The left side pull-up network is composed of the resistor 601, the PMOS transistor 602, and the PMOS transistor 603, and the right side pull-up network is composed of the resistor 604, the PMOS transistor 605, and the PMOS transistor 606. The left side pull-down network is composed of the NMOS transistor 607, and the right side pull-down network is composed of the NMOS transistor 608.

Due to the symmetric structure, the voltage potentials at the gate and the source of the PMOS transistor 602 and the PMOS transistor 605 will change simultaneously when a glitch is produced in the power lines so that the voltage difference between the gate and the source of both transistors remain unchanged. The conduction status in response to the CLK signal and the CLKB signal in the PMOS transistor 602 and the PMOS transistor 605, for example the PMOS transistor 602 being on and the PMOS transistor 605 being off, therefore remains unchanged too. The NMOS transistor 607 is off, the NMOS transistor 608 is on and no dc conducting path is present.

Besides, since the SET signal from the drain of the NMOS transistor 607 and the RESET signal from the drain of the NMOS transistor 608 are exclusively pulled up to the VBOOT potential or pulled down to the HBOUT potential, the present invention provides a large voltage swing for the following latch 103, and a large noise margin latch 103 is afforded.

Figure 10:
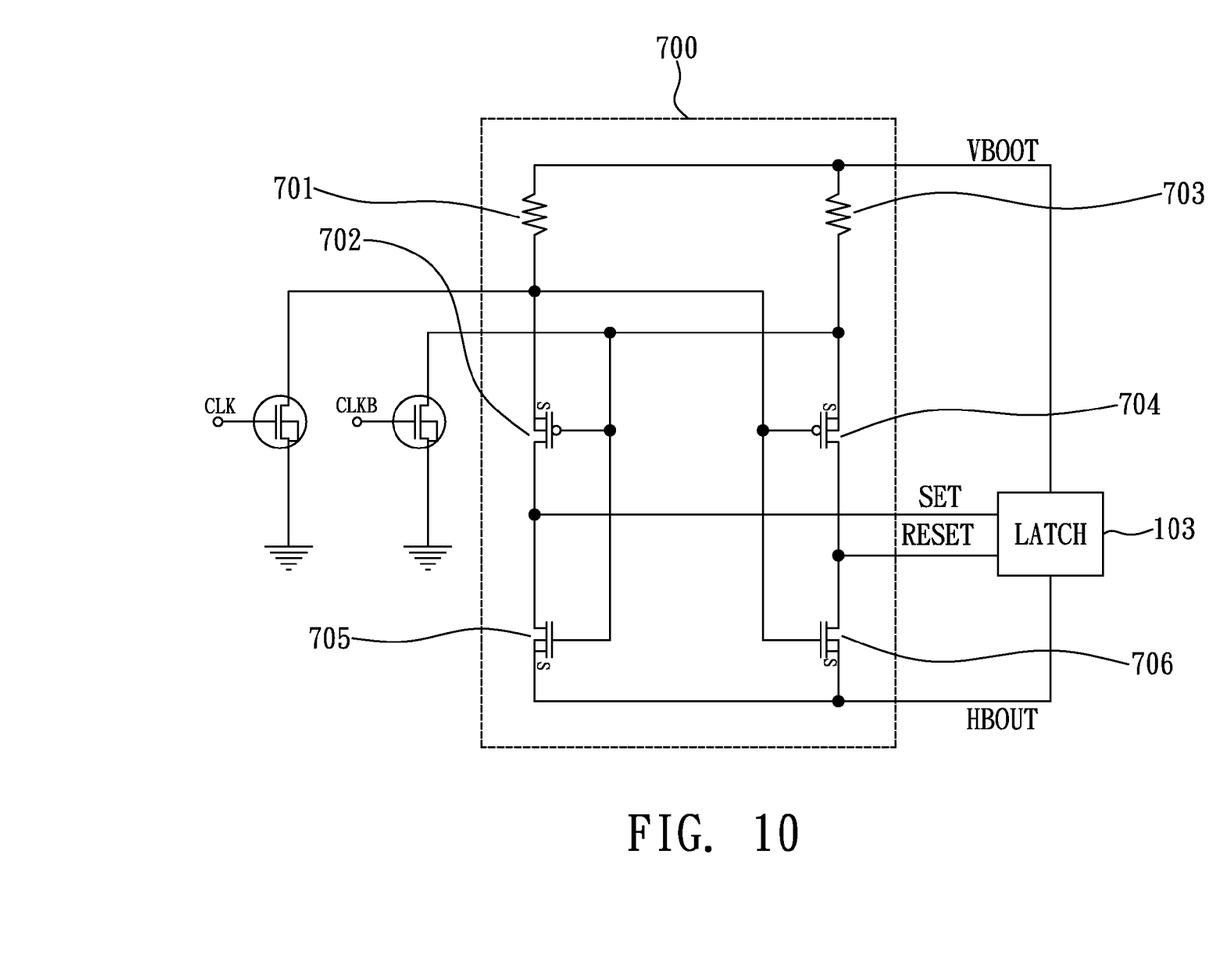
FIG. 10 is a circuit diagram of another preferred embodiment of the present invention for common-mode glitch interference cancellation.

Please refer to FIG. 10, which shows a circuit diagram of another preferred embodiment of the present invention for common-mode glitch interference cancellation. As shown in the FIG. 10, the pulse filter 700 includes a resistor 701, a PMOS transistor 702, a resistor 703, a PMOS transistor 704, an NMOS transistor 705, and an NMOS transistor 706. A CLK signal and a CLKB signal are coupled to the pulse filter 700 in the way as shown in the FIG. 10.

In this embodiment, the pulse filter 700 comprises a pair of pull-up networks and a pair of pull-down networks. The left side pull-up network is composed of the resistor 701 and the PMOS transistor 702, and the right side pull-up network is composed of the resistor 703 and the PMOS transistor 704. The left side pull-down network is composed of the NMOS transistor 705, and the right side pull-down network is composed of the NMOS transistor 706.

Due to the symmetric structure, the voltage potentials at the gate and the source of the PMOS transistor 702 and the PMOS transistor 704 will change simultaneously when a glitch is produced in the power lines so that the voltage difference between the gate and the source of both transistors remain unchanged. The conduction status in response to the CLK signal and the CLKB signal in the PMOS transistor 702 and the PMOS transistor 704, for example the PMOS transistor 702 being on and the PMOS transistor 704 being off, therefore remains unchanged too. The NMOS transistor 705 is off, the NMOS transistor 706 is on and no dc conducting path is present.

Besides, since the SET signal from the drain of the NMOS transistor 705 and the RESET signal from the drain of the NMOS transistor 706 are exclusively pulled up to the VBOOT potential or pulled down to the HBOUT potential, the present invention provides a large voltage swing for the following latch 103, and a large noise margin latch 103 is afforded.

Figure 11:
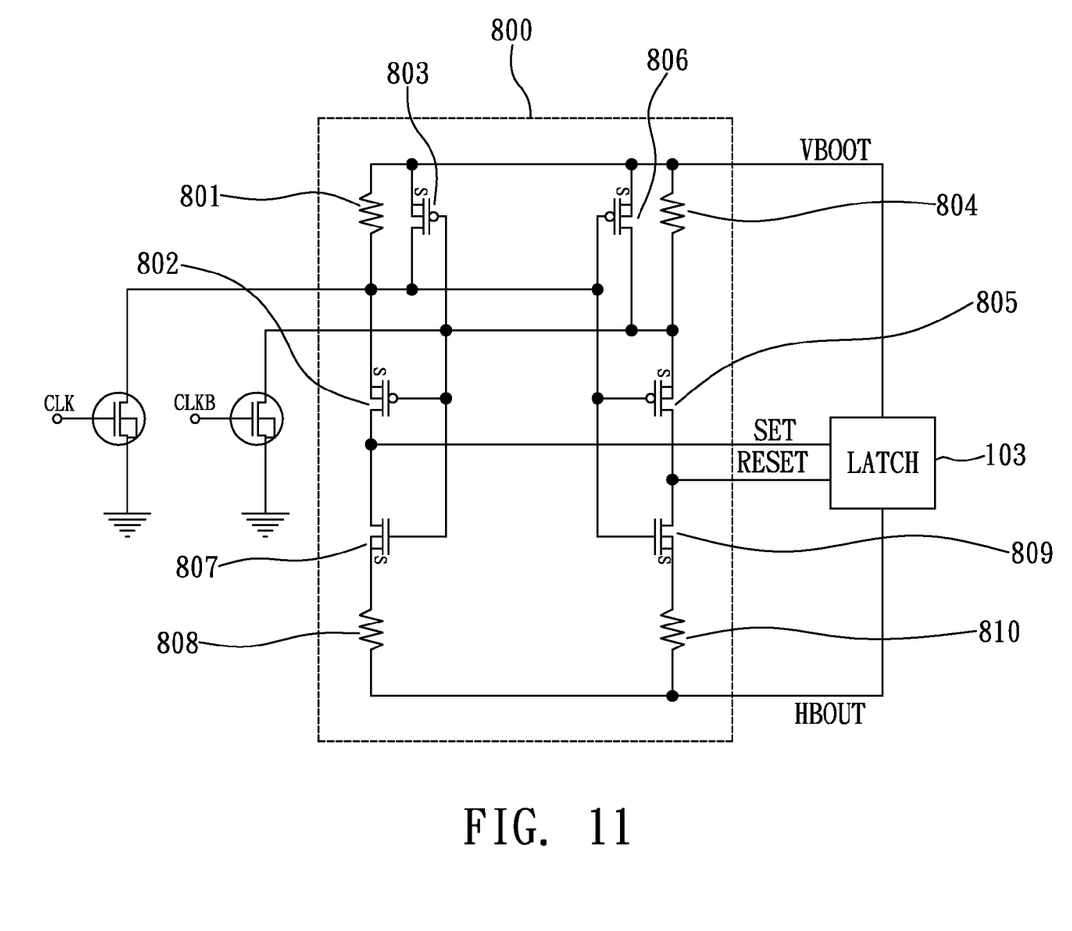
FIG. 11 is a circuit diagram of another preferred embodiment of the present invention for common-mode glitch interference cancellation.

Please refer to FIG. 11, which shows a circuit diagram of another preferred embodiment of the present invention for common-mode glitch interference cancellation. As shown in the FIG. 11, the pulse filter 800 includes a resistor 801, a PMOS transistor 802, a PMOS transistor 803, a resistor 804, a PMOS transistor 805, a PMOS transistor 806, an NMOS transistor 807, a resistor 808, an NMOS transistor 809, and a resistor 810. A CLK signal and a CLKB signal are coupled to the pulse filter 800 in the way as shown in the FIG. 11.

In this embodiment, the pulse filter 800 comprises a pair of pull-up networks and a pair of pull-down networks. The left side pull-up network is composed of the resistor 801, the PMOS transistor 802, and the PMOS transistor 803, and the right side pull-up network is composed of the resistor 804, the PMOS transistor 805, and the PMOS transistor 806. The left side pull-down network is composed of the NMOS transistor 807 and the resistor 808, and the right side pull-down network is composed of the NMOS transistor 809 and the resistor 810.

Due to the symmetric structure, the voltage potentials at the gate and the source of the PMOS transistor 802 and the PMOS transistor 805 will change simultaneously when a glitch is produced in the power lines so that the voltage difference between the gate and the source of both transistors remain unchanged. The conduction status in response to the CLK signal and the CLKB signal in the PMOS transistor 802 and the PMOS transistor 805, for example the PMOS transistor 802 being on and the PMOS transistor 805 being off, therefore remains unchanged too. The NMOS transistor 807 is off, the NMOS transistor 809 is on and no dc conducting path is present.

Besides, since the SET signal from the drain of the NMOS transistor 807 and the RESET signal from the drain of the NMOS transistor 809 are exclusively pulled up to the VBOOT potential or pulled down to the HBOUT potential, the present invention provides a large voltage swing for the following latch 103, and a large noise margin latch 103 is afforded.

Figure 12:
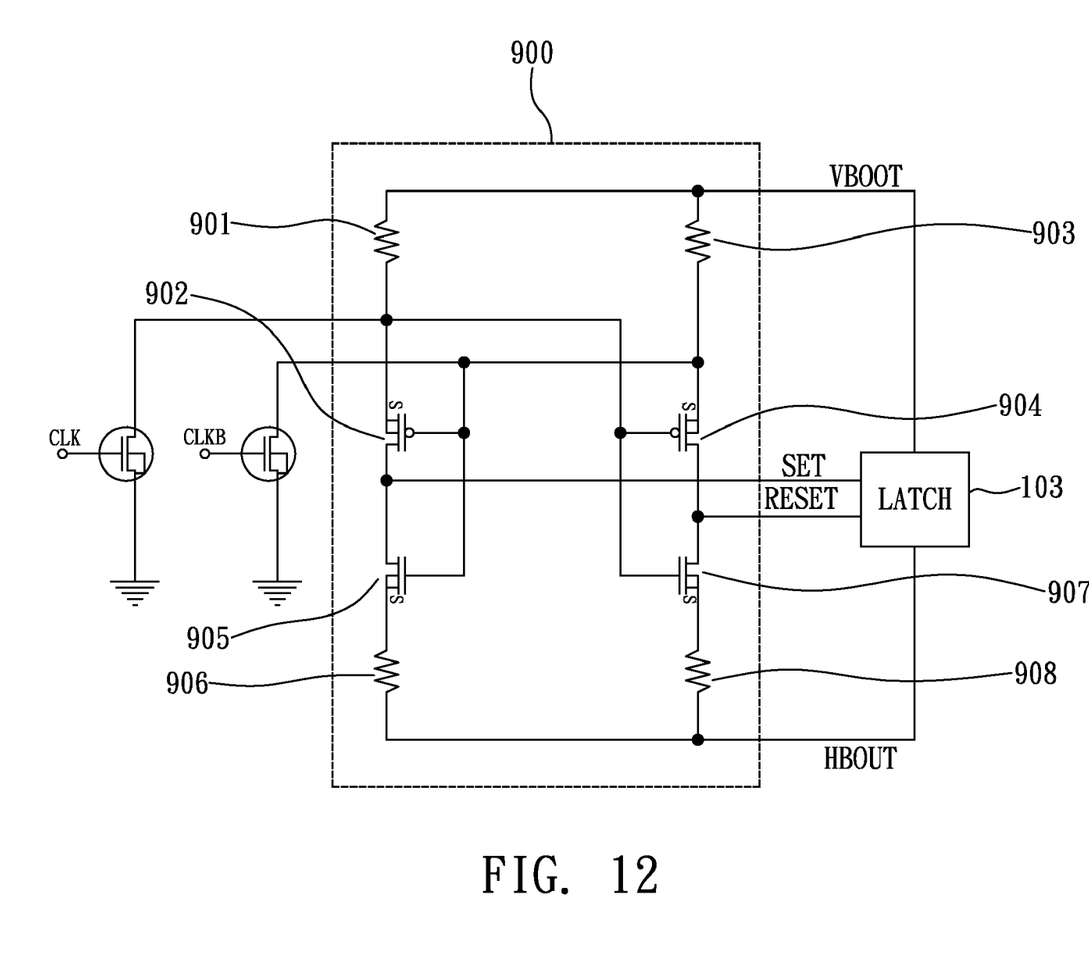
FIG. 12 is a circuit diagram of another preferred embodiment of the present invention for common-mode glitch interference cancellation.

Please refer to FIG. 12, which shows a circuit diagram of another preferred embodiment of the present invention for common-mode glitch interference cancellation. As shown in the FIG. 12, the pulse filter 900 includes a resistor 901, a PMOS transistor 902, a resistor 903, a PMOS transistor 904, an NMOS transistor 905, a resistor 906, an NMOS transistor 907, and a resistor 908. A CLK signal and a CLKB signal are coupled to the pulse filter 900 in the way as shown in the FIG. 12.

In this embodiment, the pulse filter 900 comprises a pair of pull-up networks and a pair of pull-down networks. The left side pull-up network is composed of the resistor 901 and the PMOS transistor 902, and the right side pull-up network is composed of the resistor 903 and the PMOS transistor 904. The left side pull-down network is composed of the NMOS transistor 905 and the resistor 906, and the right side pull-down network is composed of the NMOS transistor 907 and the resistor 908.

Due to the symmetric structure, the voltage potentials at the gate and the source of the PMOS transistor 902 and the PMOS transistor 904 will change simultaneously when a glitch is produced in the power lines so that the voltage difference between the gate and the source of both transistors remain unchanged. The conduction status in response to the CLK signal and the CLKB signal in the PMOS transistor 902 and the PMOS transistor 904, for example the PMOS transistor 902 being on and the PMOS transistor 904 being off, therefore remains unchanged too. The NMOS transistor 905 is off, the NMOS transistor 907 is on and no dc conducting path is present.

Besides, since the SET signal from the drain of the NMOS transistor 905 and the RESET signal from the drain of the NMOS transistor 907 are exclusively pulled up to the VBOOT potential or pulled down to the HBOUT potential, the present invention provides a large voltage swing for the following latch 103, and a large noise margin latch 103 is afforded.

In the above preferred embodiments, an active device included in the pull-down network plays the major role of the invention. According to this arrangement, the present invention attains a variety of advantages: a robust pulse filter, large voltage swing, minimum power consumption, smaller die area, and affording a large noise margin latch.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. An active-load dominant circuit for common-mode glitch interference cancellation, biased between a first voltage potential and a second voltage potential, comprising:

a pair of pull-up networks for providing access to said first voltage potential in response to a clock signal or a complemented clock signal; and a pair of active-load networks placed between said pair of pull-up networks and said second voltage potential, for generating at least one set signal and at least one reset signal for a latch, wherein said pair of active-load networks comprise at least one active device at each active-load network for accessing said second voltage potential in response to said clock signal or said complemented clock signal; and said pair of pull-up networks comprise a first resistor and a first PMOS transistor in one pull-up network, said first resistor being connected in series with said first PMOS transistor, and comprise a second resistor and a second PMOS transistor in the other pull-up network, said second resistor being connected in series with said second PMOS transistor.

2. The active-load dominant circuit for common-mode glitch interference cancellation as recited in claim 1, wherein said pair of active-load networks comprise a third resistor connected in series with a first NMOS transistor in one active-load network, and provide said latch with a set signal from one end of said third resistor, and a reset signal from one end of a fourth resistor, wherein said fourth resistor connected in series with a second NMOS transistor in the other active-load network.

3. The active-load dominant circuit for common-mode glitch interference cancellation as recited in claim 1, wherein said pair of active-load networks comprise a third resistor connected in series with a first NMOS transistor in one active-load network, and comprise a fourth resistor connected in series with a second NMOS transistor in the other active-load network.

4. The active-load dominant circuit for common-mode glitch interference cancellation as recited in claim 2, wherein said pair of active-load networks provide said latch with a set signal from the drain of said first NMOS transistor and a reset signal from the drain of said second NMOS transistor.

5. The active-load dominant circuit for common-mode glitch interference cancellation as recited in claim 2, further comprises another set signal from the other end of said third resistor and another reset signal from the other end of said fourth resistor.

6. The active-load dominant circuit for common-mode glitch interference cancellation as recited in claim 3, wherein said pair of active-load networks provide said latch with a set signal from the drain of said first NMOS transistor and a reset signal from the drain of said second NMOS transistor.

7. The active-load dominant circuit for common-mode glitch interference cancellation as recited in claim 1, wherein said pair of active-load networks comprise a third resistor connected in series with a first NMOS transistor in said one pull-up network, and provide said latch with a set signal from one end of said third resistor, and a reset signal from one end of a fourth resistor, wherein said fourth resistor is connected in series with a second NMOS transistor in the other active-load network, and wherein said complemented clock signal is coupled to the gate of said first PMOS transistor, the gate of said second PMOS transistor, the gate of said first NMOS transistor, and the drain of said third PMOS transistor, and wherein said clock signal is coupled to the gate of said third PMOS transistor, the gate of said fourth PMOS transistor, the gate of said second NMOS transistor, and the drain of said first PMOS transistor.

8. The active-load dominant circuit for common-mode glitch interference cancellation as recited in claim 1, wherein said pair of active-load networks comprise a first NMOS transistor in said one pull-up network, and comprise a second NMOS transistor in the other active-load network, and wherein said complemented clock signal is coupled to the gate of said first PMOS transistor, the gate of said second PMOS transistor, the gate of said first NMOS transistor, and the drain of said third PMOS transistor, and wherein said clock signal is coupled to the gate of said third PMOS transistor, the gate of said fourth PMOS transistor, the gate of said second NMOS transistor, and the drain of said first PMOS transistor.

9. The active-load dominant circuit for common-mode glitch interference cancellation as recited in claim 1, wherein said pair of active-load networks comprise a third resistor connected in series with a first NMOS transistor in said one pull-up network, and provide said latch with a set signal from one end of said third resistor, and a reset signal from one end of a fourth resistor, wherein said fourth resistor is connected in series with a second NMOS transistor in the other active-load network, and wherein said complemented clock signal is coupled to the gate of said first PMOS transistor, the source of said second PMOS transistor, and the gate of said first NMOS transistor, and wherein said clock signal is coupled to the gate of said second PMOS transistor, the gate of said second NMOS transistor, and the source of said first PMOS transistor.

10. The active-load dominant circuit for common-mode glitch interference cancellation as recited in claim 1, wherein said pair of active-load networks comprise a third resistor connected in series with a first NMOS transistor in one active-load network, and comprise a fourth resistor connected in series with a second NMOS transistor in the other active-load network, and wherein said complemented clock signal is coupled to the gate of said first PMOS transistor, the gate of said first NMOS transistor, and the source of said second PMOS transistor, and wherein said clock signal is coupled to the gate of said second PMOS transistor, the gate of said second NMOS transistor, and the source of said first PMOS transistor.

11. An active-load dominant circuit for common-mode glitch interference cancellation, biased between a first voltage potential and a second voltage potential, comprising:
 a pair of pull-up networks for providing access said first voltage potential in response to a clock signal or a complemented clock signal; and
 a pair of active-load networks placed between said pair of pull-up networks and said second voltage potential, for generating at least one set signal and at least one reset signal for a latch, wherein said pair of active-load networks comprise at least one active device at each active-load network for accessing to said second voltage potential in response to said clock signal or said complemented clock signal; and
 said pair of pull-up networks comprise a first resistor, a first PMOS transistor and a second PMOS transistor in one pull-up network, said first resistor being connected in parallel with said first PMOS transistor and in series with said second PMOS transistor, and comprise a second resistor, a third PMOS transistor and a fourth PMOS transistor in the other pull-up network, said second resistor being connected in parallel with said third PMOS transistor and in series with said fourth PMOS transistor.

* * * * *